US008014143B2

(12) United States Patent
Chang

(10) Patent No.: US 8,014,143 B2

(45) Date of Patent: Sep. 6, 2011

(54) PROTECTIVE COVER MECHANISM

(75) Inventor: Cheng-Lung Chang, Tu-Cheng (TW)

(73) Assignee: Chi Mei Communication Systems, Inc., Tu-Cheng, New Taipei (TW)

(*) Notice: Subject to any disclaimer, the term of this patent is extended or adjusted under 35 U.S.C. 154(b) by 164 days.

(21) Appl. No.: 12/503,740

(22) Filed: Jul. 15, 2009

(65) Prior Publication Data

US 2010/0053859 A1 Mar. 4, 2010

(30) Foreign Application Priority Data

Aug. 29, 2008 (CN) .......................... 2008 1 0304288

(51) Int. Cl.
*G06F 1/16* (2006.01)
*H05K 5/00* (2006.01)
*H05K 7/00* (2006.01)

(52) U.S. Cl. .................................................. 361/679.31

(58) Field of Classification Search ............. 361/679.02, 361/679.31, 679.33, 679.37–40; 439/135, 439/358

See application file for complete search history.

(56) References Cited

U.S. PATENT DOCUMENTS

| | | | | |
|---|---|---|---|---|
| 6,456,500 | B1 * | 9/2002 | Chen | 361/752 |
| 6,522,534 | B1 * | 2/2003 | Wu | 361/679.4 |
| 6,639,791 | B2 * | 10/2003 | Su | 361/679.33 |
| 7,035,110 | B1 * | 4/2006 | Wang et al. | 361/737 |
| 7,095,617 | B1 * | 8/2006 | Ni | 361/736 |
| 7,172,460 | B2 * | 2/2007 | Zhao et al. | 439/607.56 |
| 7,223,574 | B2 * | 5/2007 | Lei et al. | 435/135 |
| 7,241,153 | B2 * | 7/2007 | He et al. | 439/148 |
| 7,503,780 | B1 * | 3/2009 | Huang | 439/135 |
| 7,551,450 | B2 * | 6/2009 | Sugawara et al. | 361/752 |
| 7,881,051 | B2 * | 2/2011 | Kim | 361/679.31 |
| 2004/0233629 | A1 * | 11/2004 | Wang et al. | 361/684 |
| 2004/0233645 | A1 * | 11/2004 | Chen | 361/737 |
| 2005/0157462 | A1 * | 7/2005 | Sugawara et al. | 361/684 |
| 2007/0015407 | A1 * | 1/2007 | Loftus | 439/607 |
| 2007/0171620 | A1 * | 7/2007 | Lee | 361/737 |
| 2008/0158808 | A1 * | 7/2008 | Camarena et al. | 361/685 |
| 2008/0218957 | A1 * | 9/2008 | Kim | 361/684 |
| 2008/0280490 | A1 * | 11/2008 | Nguyen et al. | 439/607 |

* cited by examiner

*Primary Examiner* — Jinhee Lee
*Assistant Examiner* — Adrian S Wilson
(74) *Attorney, Agent, or Firm* — Altis Law Group, Inc.

(57) ABSTRACT

A protective cover mechanism includes a cover head and a cover body, the cover head includes a head portion and a connecting portion integrally connecting with the head portion, the connecting portion forms latching members therein, a cover body forms ribs in the inter wall thereof, the cover head fixes to the cover body by latching the latching members with the ribs.

14 Claims, 4 Drawing Sheets

PROTECTIVE COVER MECHANISM

BACKGROUND

1. Technical Field

The present disclosure relates to protective cover mechanisms for protecting, for example, USB interfaces.

2. Description of Related Art

Portable electronic devices such as mobile phones are widely used. Universal Serial Buses (USBs) are commonly assembled to the electronic devices. To prevent contaminants from entering into the inside of electronic devices through the USB interfaces, protective cover mechanisms are provided. However, the protective cover mechanisms are usually complex in structure and difficult to fabricate with the electronic devices.

Therefore, there is room for improvement within the art.

BRIEF DESCRIPTION OF THE DRAWING

Many aspects of the present protective cover mechanism can be better understood with reference to the following drawings. The components in the various drawings are not necessarily drawn to scale, the emphasis instead being placed upon clearly illustrating the principles of the present protective cover mechanism. Moreover, in the drawings, like reference numerals designate corresponding parts throughout the diagrams.

DETAILED DESCRIPTION OF THE EMBODIMENT

Figure 1:
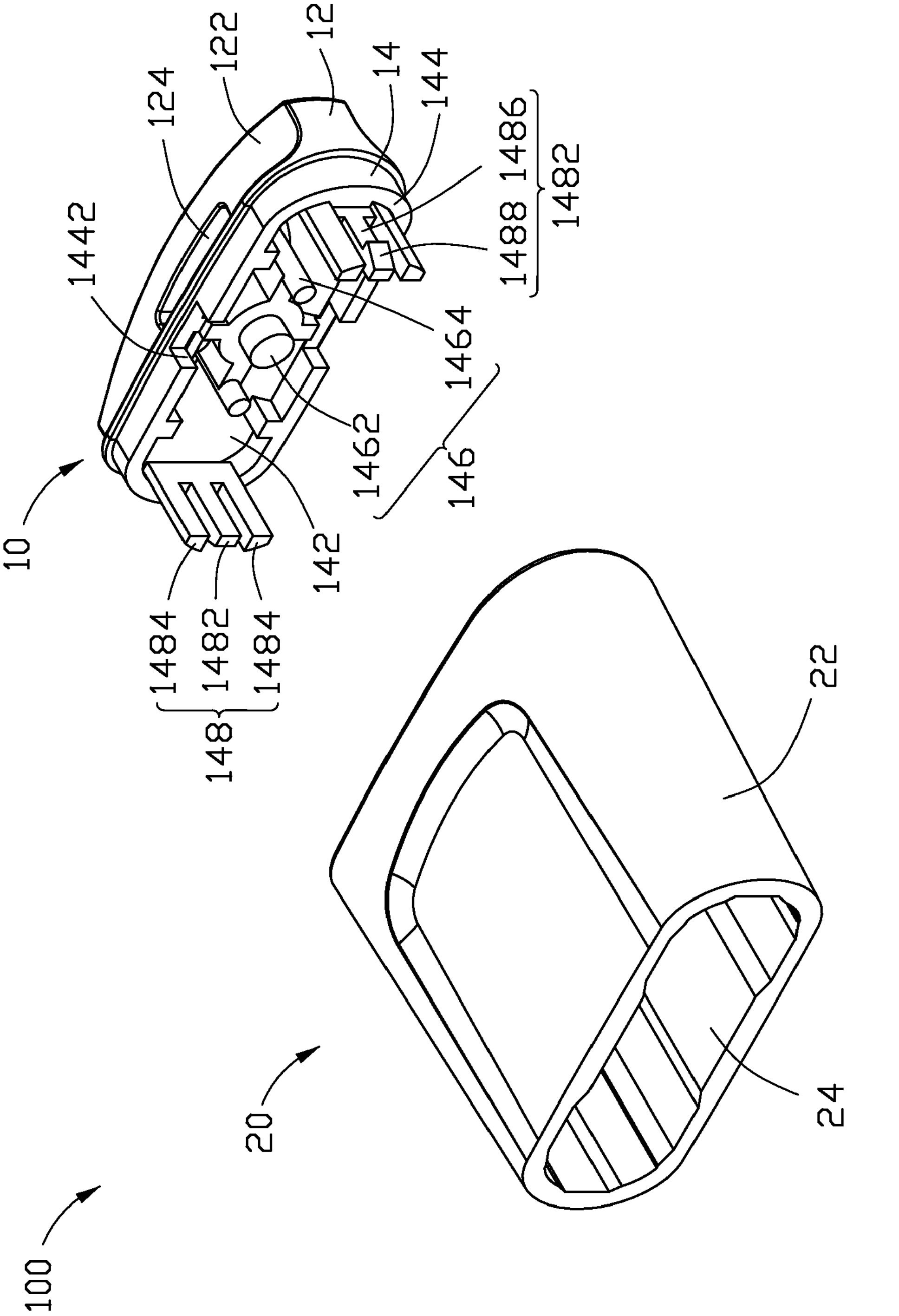
FIG. 1 is a disassembled view of the protective cover mechanism, according to an exemplary embodiment.
Figure 2:
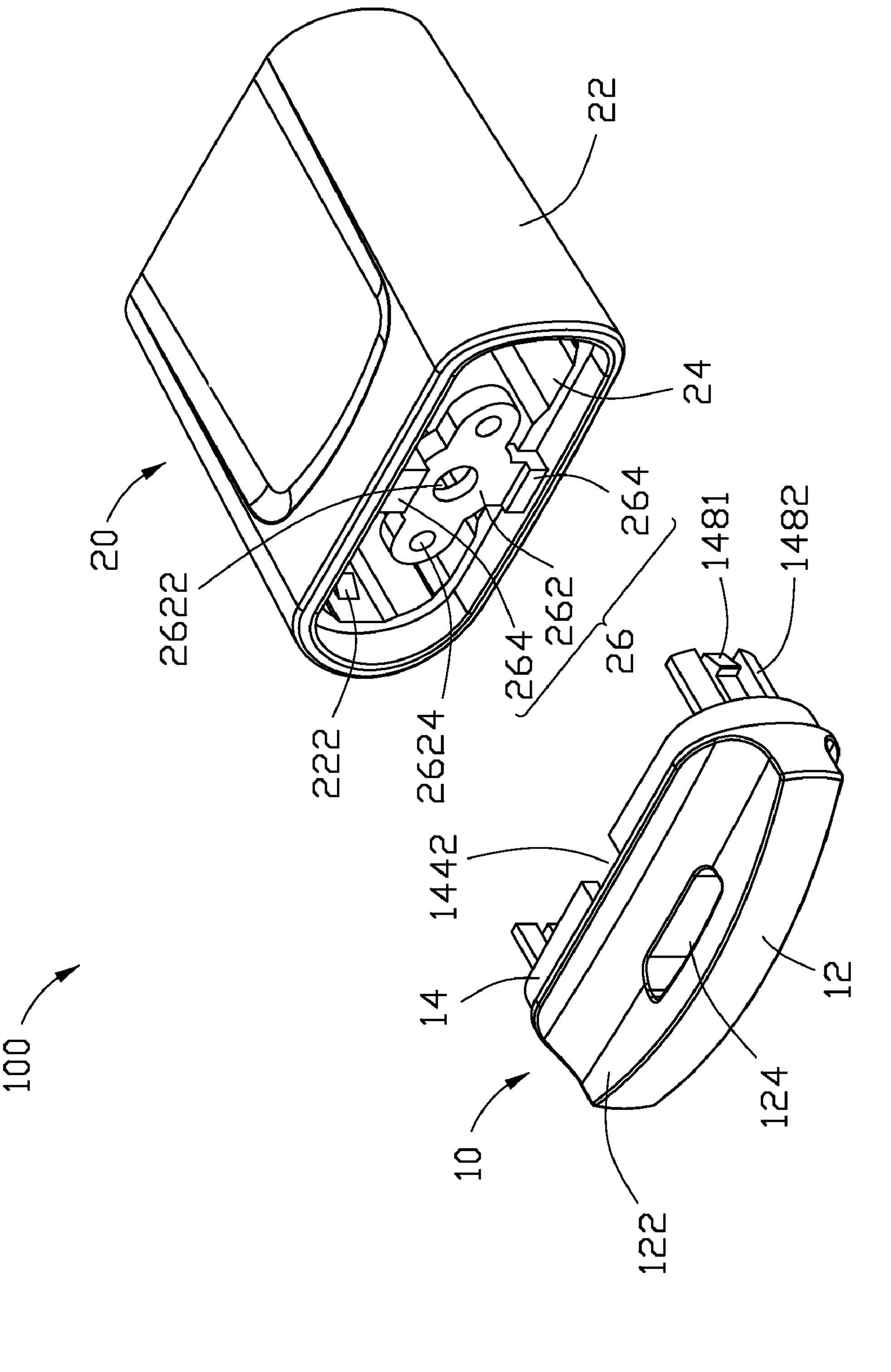
FIG. 2 is a disassembled view of the protective cover mechanism shown in FIG. 1 from a different angle.
Figure 3:
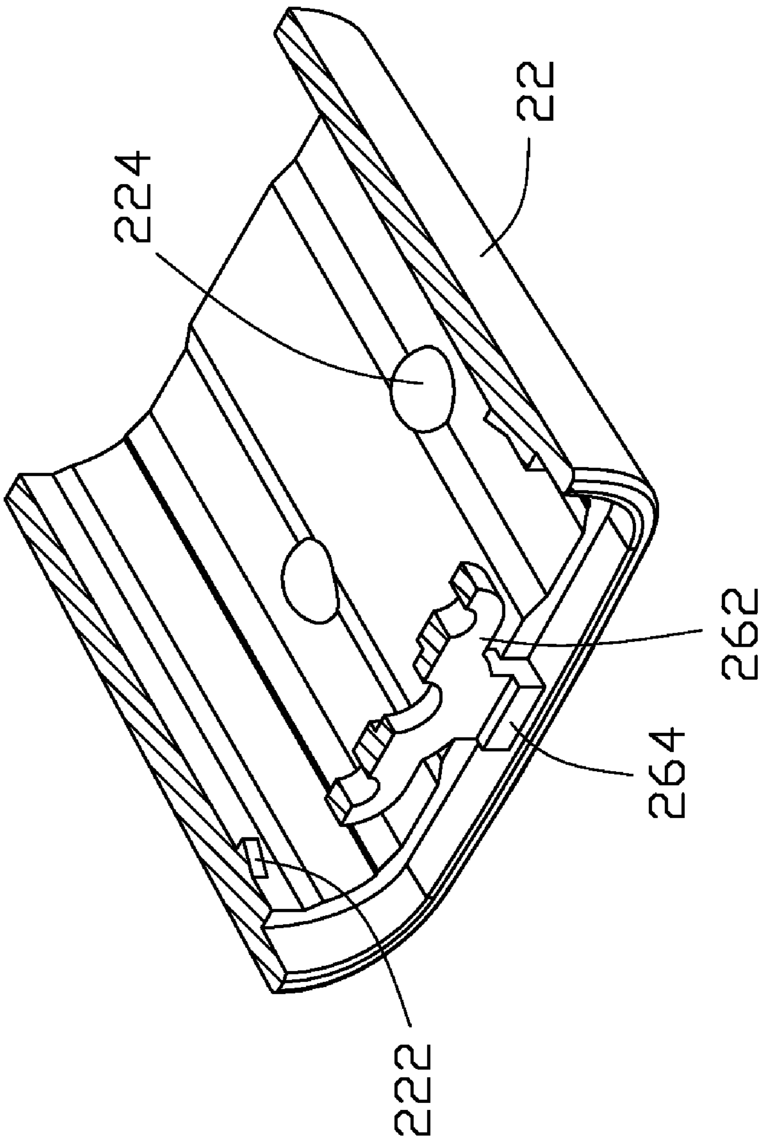
FIG. 3 is a sectional view of cover body of the protective cover mechanism shown in FIG. 1.

Referring to FIGS. 1 and 2, an exemplary protective cover mechanism 100, which can be used in mobile phones and other portable electronic devices for protecting and covering USB interfaces, includes a cover head 10 and a cover body 20 assembled with the cover head 10.

The cover head 10 includes a head portion 12 connected to a connecting portion 14. The head portion 12 has two adjacent arcuate surfaces 122 and an aperture 124 defined through the two arcuate surfaces 122. A decorative article can be attached to the cover mechanism 100 by passing a fastener such as a string or chain through the aperture 124 that is connected to, for example, a charm or key fob. The connecting portion 14 protrudes from the head portion 12 opposite to the two arcuate surfaces 122. The connecting portion 14 defines a recess 142 which is enclosed by a peripheral wall 144. The peripheral wall 144 defines two opposite through holes 1442.

A positioning member 146 and two latching members 148 extend from a surface of the recess 142 to outside of the recess 142. The positioning member 146 is located in the center of the recess 142 and includes a central pole 1462 and two peripheral poles 1464 arranged symmetrically about the central pole 1462. The central pole 1462 and the two peripheral poles 1464 are used to fix the cover head 10 to the cover body 20.

The two latching members 148 are oppositely arranged on the two sides of the recess 142 and adjacent to the peripheral wall 144. Each latching member 148 includes a latching block 1482 and two parallel guiding blocks 1484 on two opposite sides of the latching block 1482. The latching block 1482 includes a block portion 1486 and a hook portion 1488 laterally extending from the block portion 1486. The hook portion 1488 is wedge-shaped for latching to the cover body 20. The guiding block 1484 is used to guide the cover head 10 to latch to the cover body 20.

The hollow cover body 20 includes a tube wall 22, a cavity 24 surrounded by the tube wall 22, and an engaging member 26 connected to the tube wall 22 in the cavity 24. The tube wall 22 has two ribs 222 and two groups of protuberances 224 at the interior surface. The two ribs 222 are configured to latch with the two latching members 148. Each group has two protuberances 224 arranged at a planar interior surface of the cover body 20.

The engaging member 26 includes a plate portion 262 and two connecting portions 264 connected to the interior wall of the tube wall 22. The plate portion 262 defines a central hole 2622 and two peripheral holes 2624 for receiving the central pole 1462 and two peripheral poles 1464 respectively. The connecting portions 264 are configured for engaging in the holes 1442 of the cover head 10.

Figure 4:
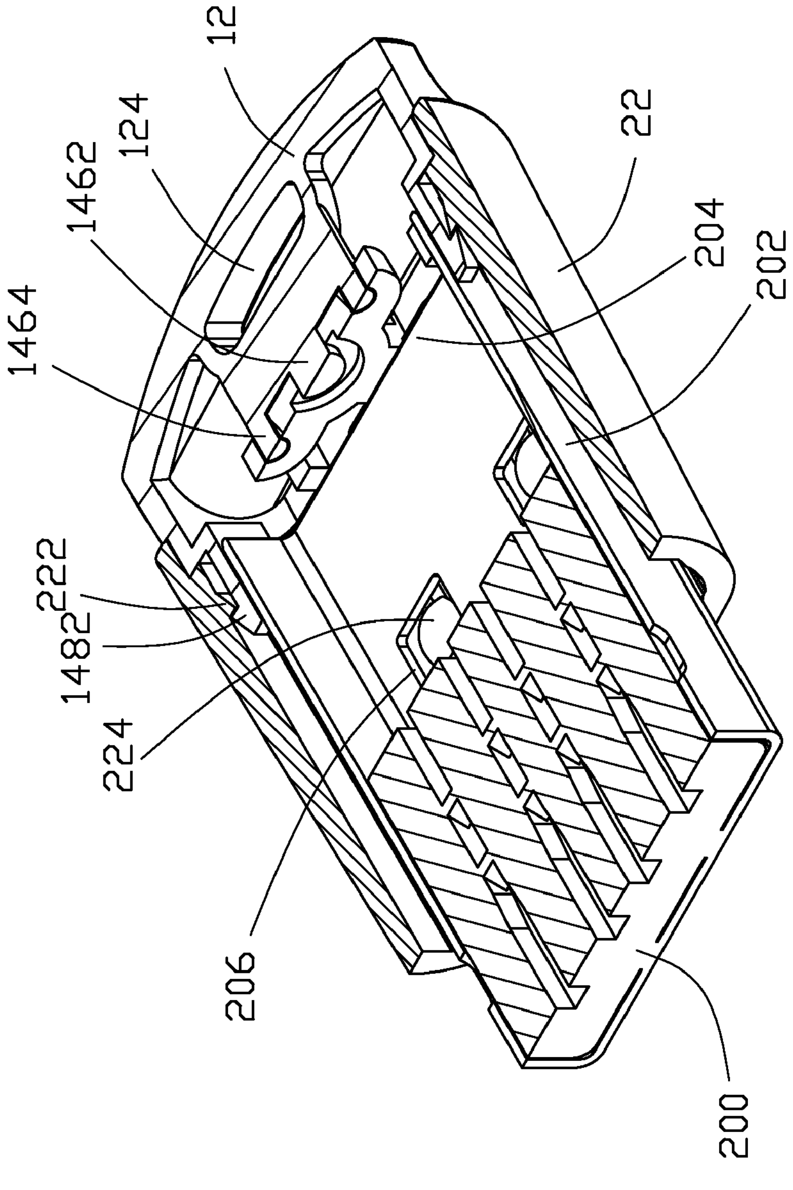
FIG. 4 is an assembled sectional view with the protective cover mechanism assembled with a USB interface.

Referring to FIG. 4, to assemble the cover head 10 to the cover body 20, the connecting portion 14 can be inserted into the tub wall 22 and engages with the engaging member 26. The central pole 1462 and the peripheral poles 1464 of the positioning member 146 extend into the central hole 2622 and the peripheral holes 2624 of the plate portion 262 correspondingly. The central pole 1462 and the peripheral poles 1464 can be fixed to the plate portion 262. The connecting portions 264 are received in the holes 1442 of the peripheral wall 144. At this time, the hook portions 1488 of the latching block 1482 latch to the ribs 222 of the tube wall 22 respectively, enabling the cover head to be secured to the cover body 20.

Referring again to FIG. 4, a USB interface 200 is covered by the protective cover mechanism 100. The USB interface 200 includes a base 202 and a connecting port 204 to engage the protective cover mechanism 100, the base 202 defines two engaging holes 206. When the USB interface 200 is assembled in a recess of an electronic device, the connecting port 204 is exposed outside from the recess for engaging and being covered by the protective cover mechanism 100. As such, the two protuberances 224 latch into the two engaging holes 206, the sidewall of the base 202 resists against the latching blocks 1482. To remove the protective cover mechanism 100 from the USB interface 200, the two protuberances 224 are slid out of the engaging holes 206.

It is to be understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A protective cover mechanism, comprising:

a cover head including a head portion and a connecting portion integrally connected to the head portion, the connecting portion defining a recess and forming a peripheral wall enclosing the recess, the peripheral wall defining through holes therein;

a cover body forming ribs in the inner wall thereof, the cover body having an engaging member connected to the inner wall, the engaging member forming protrusions for receiving in the through holes correspondingly;

wherein the connecting portion forms latching members therein, the cover head fixes to the cover body by latching the latching members with the ribs.

2. The protective cover mechanism as claimed in claim 1, wherein the latching members includes a latching block forming hook portion, the hook portion latches with the rib.

3. The protective cover mechanism as claimed in claim 1, wherein the latching member includes two guiding blocks located on two opposite sides of the latching block, the guiding blocks are used to guide the cover head latching to the cover body.

4. The protective cover mechanism as claimed in claim 1, wherein the connecting portion forms a positioning member, the cover body has an engaging member, the positioning member engages with the engaging member.

5. The protective cover mechanism as claimed in claim 4, wherein the positioning member includes a central pole and two peripheral poles arranged symmetrically about the central pole, the engaging member includes a plate portion, the plate portion defines a central hole and two peripheral holes for receiving in the central pole and two peripheral poles correspondingly.

6. The protective cover mechanism as claimed in claim 4, wherein the positioning member and the latching members protrude from the recess.

7. The protective cover mechanism as claimed in claim 1, wherein the head portion defines an aperture for hanging decorative pieces.

8. A protective cover mechanism, comprising:

a cover head including a head portion and a connecting portion integrally connected to the head portion, the connecting portion defining a recess and forming a peripheral wall enclosing the recess, the peripheral wall defining through holes therein;

a cover body forming an engaging member in the inner cavity thereof, the engaging member forming protrusions for receiving in the through holes correspondingly;

wherein the connecting portion forms positioning members therein, the cover head fixes to the cover body by engagement the positioning member of the cover head with the engaging member of the cover body.

9. The protective cover mechanism as claimed in claim 8, wherein the position member includes a central pole and two peripheral poles arranged symmetrically about the central pole, the engaging member includes a plate portion, the plate portion defines a central hole and two peripheral holes, the central pole and two peripheral poles receive in and latch with the central hole and two peripheral holes correspondingly.

10. The protective cover mechanism as claimed in claim 8, wherein cover body forms ribs in the inner wall thereof, the connecting portion forms latching members therein, the latching members latch with the ribs.

11. The protective cover mechanism as claimed in claim 10, wherein the latching member includes a latching block forming hook portion, the hook portion latches with the rib.

12. The protective cover mechanism as claimed in claim 10, wherein the latching members includes two guiding blocks located on two opposite sides of the latching block, the guiding blocks is used to guide the cover head latching to the cover body.

13. The protective cover mechanism as claimed in claim 10, wherein the positioning member and the latching members protrude from the recess.

14. The protective cover mechanism as claimed in claim 8, wherein the head portion defines an aperture for hanging decorative pieces.

* * * * *